(12) United States Patent
Namuduri et al.

(10) Patent No.: US 9,664,159 B2
(45) Date of Patent: May 30, 2017

(54) PARAMETER ESTIMATION IN AN ACTUATOR

(71) Applicant: GM GLOBAL TECHNOLOGY OPERATIONS LLC, Detroit, MI (US)

(72) Inventors: Chandra S. Namuduri, Troy, MI (US); Thomas Wolfgang Nehl, Shelby Township, MI (US); Avoki M. Omekanda, Rochester, MI (US); Suresh Gopalakrishnan, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 93 days.

(21) Appl. No.: 14/658,331

(22) Filed: Mar. 16, 2015

(65) Prior Publication Data

US 2015/0267663 A1    Sep. 24, 2015

Related U.S. Application Data

(60) Provisional application No. 61/968,048, filed on Mar. 20, 2014, provisional application No. 61/968,145, filed on Mar. 20, 2014.

(51) Int. Cl.
| | |
|---|---|
| *F02M 51/00* | (2006.01) |
| *F02D 41/20* | (2006.01) |
| *F02M 51/06* | (2006.01) |
| *G01K 13/00* | (2006.01) |
| *G01R 31/06* | (2006.01) |
| *H01F 7/18* | (2006.01) |
| *H01F 7/16* | (2006.01) |

(52) U.S. Cl.
CPC ........... *F02M 51/005* (2013.01); *F02D 41/20* (2013.01); *F02M 51/061* (2013.01); *G01K 13/00* (2013.01); *G01R 31/06* (2013.01); *H01F 7/1844* (2013.01); *F02D 2041/2058* (2013.01); *F02D 2041/2065* (2013.01); *H01F 7/1638* (2013.01)

(58) Field of Classification Search
CPC ............ F02D 41/20; F02D 2041/2058; F02D 2041/2065; F02M 51/00; F02M 51/005; F02M 51/061; F01L 2009/04; F01L 2009/0405; F01L 2009/0423; F01L 2009/0478; G01K 13/00; G01R 31/06; H01F 7/064
USPC .................... 123/478, 480, 482; 251/129.16; 361/152, 154, 160
See application file for complete search history.

(56) References Cited

U.S. PATENT DOCUMENTS

| | | | | |
|---|---|---|---|---|
| 5,467,244 | A * | 11/1995 | Jayawant | ............ F16C 32/0448 361/144 |
| 2006/0016435 | A1* | 1/2006 | Kirkpatrick | ............. F02D 41/20 123/490 |
| 2007/0158607 | A1* | 7/2007 | Fey | .......................... B60T 8/36 251/129.16 |
| 2007/0285195 | A1 | 12/2007 | Nehl | |

(Continued)

*Primary Examiner* — John Kwon
*Assistant Examiner* — Johnny H Hoang

(57) ABSTRACT

A method for parameter estimation in an electromagnetic actuator having a main coil and a search coil includes driving a current through the main coil, determining a main coil voltage, determining a search coil voltage, determining a main coil current, and estimating at least one parameter of the actuator based on the main coil voltage, the search coil voltage and the main coil current.

14 Claims, 2 Drawing Sheets

(56) References Cited

U.S. PATENT DOCUMENTS

2015/0136559 A1\* 5/2015 Brumberger .......... F16D 48/064
192/84.9

\* cited by examiner

PARAMETER ESTIMATION IN AN ACTUATOR

CROSS REFERENCE TO RELATED APPLICATIONS

This application claims the benefit of U.S. provisional Application No. 61/968,048, filed on Mar. 20, 2014, and U.S. provisional Application No. 61/968,145, filed on Mar. 20, 2014, both of which are incorporated by reference.

TECHNICAL FIELD

This disclosure is related to solenoid-activated actuators.

BACKGROUND

The statements in this section merely provide background information related to the present disclosure. Accordingly, such statements are not intended to constitute an admission of prior art.

Solenoid actuators can be used to control fluids (liquids and gases), or for positioning or for control functions. A typical example of a solenoid actuator is the fuel injector. Fuel injectors are used to inject pressurized fuel into a manifold, an intake port, or directly into a combustion chamber of internal combustion engines. Known fuel injectors include electromagnetically-activated solenoid devices that overcome mechanical springs to open a valve located at a tip of the injector to permit fuel flow therethrough. Injector driver circuits control flow of electric current to the electromagnetically-activated solenoid devices to open and close the injectors. Injector driver circuits may operate in a peak-and-hold control configuration or a saturated switch configuration.

Fuel injectors are calibrated, with a calibration including an injector activation signal including an injector open-time, or injection duration, and a corresponding metered or delivered injected fuel mass operating at a predetermined or known fuel pressure. Injector operation may be characterized in terms of injected fuel mass per fuel injection event in relation to injection duration. Injector characterization includes metered fuel flow over a range between high flowrate associated with high-speed, high-load engine operation and low flowrate associated with engine idle conditions.

It is known for engine control to benefit from injecting a plurality of small injected fuel masses in rapid succession. Generally, when a dwell time between consecutive injection events is less than a dwell time threshold, injected fuel masses of subsequent fuel injection events often result in a larger delivered magnitude than what is desired even through equal injection durations are utilized. Accordingly, such subsequent fuel injection events can become unstable resulting in unacceptable repeatability. Fuel injectors are often affected by the operating temperature at any given time. Knowledge of the instantaneous operating temperature of the fuel injector can therefore be useful for controlling fuel injection events of the fuel injector. It is known to correlate resistance of an electrical circuit to operating temperature. When activation of the fuel injector is controlled based upon electrical current applied to an electrical coil, it is difficult to estimate the resistance of the electrical coil due to resistance drops that occur in response to transitions in electrical current applied to the electrical coil.

SUMMARY

A method for parameter estimation in an electromagnetic actuator having a main coil and a search coil includes driving a current through the main coil, determining a main coil voltage, determining a search coil voltage, determining a main coil current, and estimating at least one parameter of the actuator based on the main coil voltage, the search coil voltage and the main coil current.

BRIEF DESCRIPTION OF THE DRAWINGS

One or more embodiments will now be described, by way of example, with reference to the accompanying drawings, in which.

DETAILED DESCRIPTION

This disclosure describes the concepts of the presently claimed subject matter with respect to an exemplary application to linear motion fuel injectors. However, the claimed subject matter is more broadly applicable to any linear or non-linear electromagnetic actuator that employs an electrical coil for inducing a magnetic field within a magnetic core resulting in an attractive force acting upon a movable armature. Typical examples include fluid control solenoids, gasoline or diesel or CNG fuel injectors employed on internal combustion engines and non-fluid solenoid actuators for positioning and control.

Figure 1:
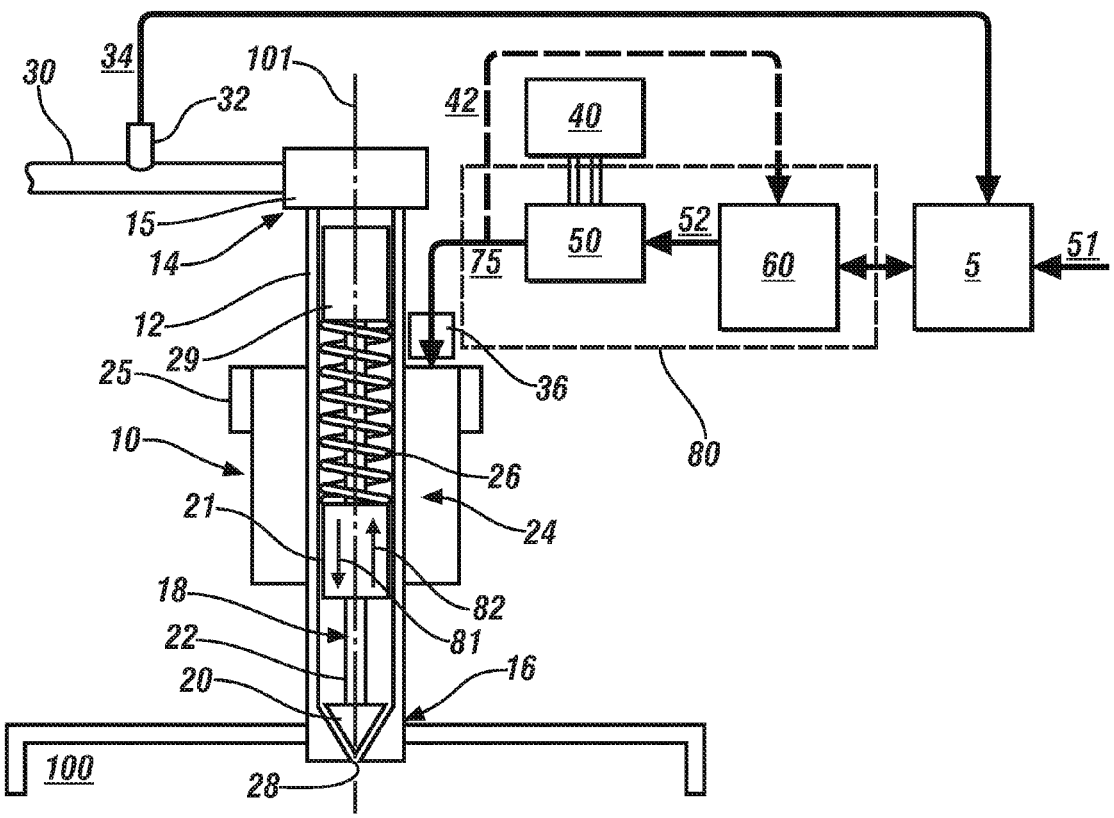
FIG. 1 illustrates a schematic sectional view of a fuel injector and an activation controller, in accordance with the present disclosure.

Referring now to the drawings, wherein the showings are for the purpose of illustrating certain exemplary embodiments only and not for the purpose of limiting the same, FIG. 1 schematically illustrates a non-limiting exemplary embodiment of an electromagnetically-activated direct-injection fuel injector 10. While an electromagnetically-activated direct-injection fuel injector is depicted in the illustrated embodiment, a port-injection fuel injector is equally applicable. The fuel injector 10 is configured to inject fuel directly into a combustion chamber 100 of an internal combustion engine. An activation controller 80 electrically operatively connects to the fuel injector 10 to control activation thereof. The activation controller 80 corresponds to only the fuel injector 10. In the illustrated embodiment, the activation controller 80 includes a control module 60 and an injector driver 50. The control module 60 electrically operatively connects to the injector driver 50 that electrically operatively connects to the fuel injector 10 to control activation thereof. The fuel injector 10, control module 60 and injector driver 50 may be any suitable devices that are configured to operate as described herein. In the illustrated embodiment, the control module 60 includes a processing device. In one embodiment, one or more components of the activation controller 80 are integrated within a connection assembly 36 of the fuel injector 36. In another embodiment, one or more components of the activation controller 80 are integrated within a body 12 of the fuel injector 10. In even yet another embodiment, one or more components of the activation controller 80 are external to—and in close proximity with—the fuel injector 10 and electrically operatively connected to the connection assembly 36 via one or more cables and/or wires. The terms "cable" and "wire" will be used interchangeably herein to provide transmission of electrical power and/or transmission of electrical signals.

Control module, module, control, controller, control unit, processor and similar terms mean any one or various combinations of one or more of Application Specific Integrated Circuit(s) (ASIC), electronic circuit(s), central processing unit(s) (preferably microprocessor(s)) and associated memory and storage (read only, programmable read only, random access, hard drive, etc.) executing one or more software or firmware programs or routines, combinational logic circuit(s), input/output circuit(s) and devices, appropriate signal conditioning and buffer circuitry, and other components to provide the described functionality. Software, firmware, programs, instructions, routines, code, algorithms and similar terms mean any instruction sets including calibrations and look-up tables. The control module has a set of control routines executed to provide the desired functions. Routines are executed, such as by a central processing unit, and are operable to monitor inputs from sensing devices and other networked control modules, and execute control and diagnostic routines to control operation of actuators. Routines may be executed at regular intervals, for example each 3.125, 6.25, 12.5, 25 and 100 milliseconds during ongoing engine and vehicle operation. Alternatively, routines may be executed in response to occurrence of an event.

In general, an armature is controllable to one of an actuated position and a static or rest position. The fuel injector 10 may be any suitable discrete fuel injection device that is controllable to one of an open (actuated) position and a closed (static or rest) position. In one embodiment, the fuel injector 10 includes a cylindrically-shaped hollow body 12 defining a longitudinal axis 101. A fuel inlet 15 is located at a first end 14 of the body 12 and a fuel nozzle 28 is located at a second end 16 of the body 12. The fuel inlet 15 is fluidly coupled to a high-pressure fuel line 30 that fluidly couples to a high-pressure injection pump. A valve assembly 18 is contained in the body 12, and includes a needle valve 20, a spring-activated pintle 22 and an armature portion 21. The needle valve 20 interferingly seats in the fuel nozzle 28 to control fuel flow therethrough. While the illustrated embodiment depicts a triangularly-shaped needle valve 20, other embodiments may utilize a ball. In one embodiment, the armature portion 21 is fixedly coupled to the pintle 22 and configured to linear translate as a unit with the pintle 22 and the needle valve 20 in first and second directions 81, 82, respectively. In another embodiment, the armature portion 21 may be slidably coupled to the pintle 22. For instance, the armature portion 21 may slide in the first direction 81 until being stopped by a pintle stop fixedly attached to the pintle 22. Likewise, the armature portion 21 may slide in the second direction 82 independent of the pintle 22 until contacting a pintle stop fixedly attached to the pintle 22. Upon contact with the pintle stop fixedly attached to the pintle 22, the force of the armature portion 21 causes the pintle 22 to be urged in the second direction 82 with the armature portion 21. The armature portion 21 may include protuberances to engage with various stops within the fuel injector 10.

An annular electromagnet assembly 24, including an electrical coil and a magnetic core, is configured to magnetically engage the armature portion 21 of the valve assembly 18. The electric coil and magnetic core assembly 24 is depicted for illustration purposes to be outside of the body of the fuel injector 10; however, embodiments herein are directed toward the electric coil and magnetic core assembly 24 to be either integral to, or integrated within, the fuel injector 10. The electric coil is wound onto the magnetic core, and includes terminals for receiving electrical current from the injector driver 50. Hereinafter, the "electrical coil and magnetic core assembly" will simply be referred to as an "electrical coil 24". When the electrical coil 24 is deactivated and de-energized, the spring 26 urges the valve assembly 18 including the needle valve 20 toward the fuel nozzle 28 in the first direction 81 to close the needle valve 20 and prevent fuel flow therethrough. When the electrical coil 24 is activated and energized, electromagnetic force acts on the armature portion 21 to overcome the spring force exerted by the spring 26 and urges the valve assembly 18 in the second direction 82, moving the needle valve 20 away from the fuel nozzle 28 and permitting flow of pressurized fuel within the valve assembly 18 to flow through the fuel nozzle 28. The fuel injector 10 may include a stopper 29 that interacts with the valve assembly 18 to stop translation of the valve assembly 18 when it is urged to open. In one embodiment, a pressure sensor 32 is configured to obtain fuel pressure 34 in the high-pressure fuel line 30 proximal to the fuel injector 10, preferably upstream of the fuel injector 10. In another embodiment, a pressure sensor may be integrated within the inlet 15 of the fuel injector in lieu of the pressure sensor 32 in the fuel rail 30 or in combination with the pressure sensor. The fuel injector 10 in the illustrated embodiment of FIG. 1 is not limited to the spatial and geometric arrangement of the features described herein, and may include additional features and/or other spatial and geometric arrangements known in the art for operating the fuel injector 10 between open and closed positions for controlling the delivery of fuel to the engine 100.

The control module 60 generates an injector command signal 52 that controls the injector driver 50, which activates the fuel injector 10 to the open position for affecting a fuel injection event. In the illustrated embodiment, the control module 60 communicates with one or more external control modules such as an engine control module (ECM) 5; however, the control module 60 may be integral to the ECM in other embodiments. The injector command signal 52 correlates to a desired mass of fuel to be delivered by the fuel injector 10 during the fuel injection event. Similarly, the injector command signal 52 may correlate to a desired fuel flow rate to be delivered by the fuel injector 10 during the fuel injection event. As used herein, the term "desired injected fuel mass" refers to the desired mass of fuel to be delivered to the engine by the fuel injector 10. As used herein, the term "desired fuel flow rate" refers to the rate at which fuel is to be delivered to the engine by the fuel injector 10 for achieving the desired mass of fuel. The desired injected fuel mass can be based upon one or more monitored input parameters 51 input to the control module 60 or ECM 5. The one or more monitored input parameters 51 may include, but are not limited to, an operator torque request, manifold absolute pressure (MAP), engine speed, engine temperature, fuel temperature, and ambient temperature obtained by known methods. The injector driver 50 generates an injector activation signal 75 in response to the injector command signal 52 to activate the fuel injector 10. The injector activation signal 75 controls current flow to the electrical coil 24 to generate electromagnetic force in response to the injector command signal 52. An electric power source 40 provides a source of DC electric power for the injector driver 50. In some embodiments, the DC electric power source provides low voltage, e.g., 12 V, and a boost converter may be utilized to output a high voltage, e.g., 24V to 200 V, that is supplied to the injector driver 50. When activated using the injector activation signal 75, the electromagnetic force generated by the electrical coil 24 urges the armature portion 21 in the second direction 82. When the armature portion 21 is urged in the second direction 82, the valve assembly 18 in consequently caused to urge or translate in the second direction 82 to an open position, allowing pressurized fuel to flow therethrough. The injector driver 50 controls the injector activation signal 75 to the electrical coil 24 by any suitable method, including, e.g., pulsewidth-modulate (PWM) electric power flow. The injector driver 50 is configured to control activation of the fuel injector 10 by generating suitable injector activation signals 75. In embodiments that employ a plurality of successive fuel injection events for a given engine cycle, an injector activation signal 75, that is fixed for each of the fuel injection events within the engine cycle, may be generated.

The injector activation signal 75 is characterized by an injection duration and a current waveform that includes an initial peak pull-in current and a secondary hold current. The initial peak pull-in current is characterized by a steady-state ramp up to achieve a peak current, which may be selected as described herein. The initial peak pull-in current generates electromagnetic force in the electrical coil 24 that acts on the armature portion 21 of the valve assembly 18 to overcome the spring force and urge the valve assembly 18 in the second direction 82 to the open position, initiating flow of pressurized fuel through the fuel nozzle 28. When the initial peak pull-in current is achieved, the injector driver 50 reduces the current in the electrical coil 24 to the secondary hold current. The secondary hold current is characterized by a somewhat steady-state current that is less than the initial peak pull-in current. The secondary hold current is a current level controlled by the injector driver 50 to maintain the valve assembly 18 in the open position to continue the flow of pressurized fuel through the fuel nozzle 28. The secondary hold current is preferably indicated by a minimum current level. In some embodiments, the injector driver 50 is configured as a bi-directional current driver capable of providing a negative current flow for drawing current from the electrical coil 24. As used herein, the term "negative current flow" refers to the direction of the current flow for energizing the electrical coil to be reversed. Accordingly, the terms "negative current flow" and "reverse current flow" are used interchangeably herein. In embodiments when the injector driver 50 is configured as the bi-directional current driver, the injector activation signal 75 may be additionally characterized by the negative current flow for drawing current from the electrical coil 24.

Embodiments herein are directed toward controlling the fuel injector for a plurality of fuel injection events that are closely-spaced during an engine cycle. As used herein, the term "closely-spaced" refers to a dwell time between each consecutive fuel injection event being less than a predetermined dwell time threshold. As used herein, the term "dwell time" refers to a period of time between an end of injection for the first fuel injection event (actuator event) and a start of injection for a corresponding second fuel injection event (actuator event) of each consecutive pair of fuel injection events. The dwell time threshold can be selected to define a period of time such that dwell times less than the dwell time threshold are indicative of producing instability and/or deviations in the magnitude of injected fuel mass delivered for each of the fuel injection events. The instability and/or deviations in the magnitude of injected fuel mass may be responsive to a presence of secondary magnetic impacts. The secondary magnetic impacts include persistent eddy currents and magnetic hysteresis within the fuel injector and a residual flux based thereon. The persistent eddy currents and magnetic hysteresis are present due to transitions in initial flux values between the closely-spaced fuel injection events. Accordingly, the dwell time threshold is not defined by any fixed value, and selection thereof may be based upon, but not limited to, fuel temperature, fuel injector temperature, fuel injector type, fuel pressure and fuel properties such as fuel types and fuel blends. As used herein, the term "flux" refers to magnetic flux indicating the total magnetic field generated by the electrical coil 24 and passing through the armature portion. Since the turns of the electrical coil 24 link the magnetic flux in the magnetic core, this flux can therefore be equated from the flux linkage. The flux linkage is based upon the flux density passing through the armature portion, the surface area of the armature portion adjacent to the air gap and the number of turns of the coil 24. Accordingly, the terms "flux", "magnetic flux" and "flux linkage" will be used interchangeably herein unless otherwise stated.

For fuel injection events that are not closely spaced, a fixed current waveform independent of dwell time may be utilized for each fuel injection event because the first fuel injection event of a consecutive pair has little influence on the delivered injected fuel mass of the second fuel injection event of the consecutive pair. However, the first fuel injection event may be prone to influence the delivered injected fuel mass of the second fuel injection event, and/or further subsequent fuel injection events, when the first and second fuel injection events are closely-spaced and a fixed current wave form is utilized. Any time a fuel injection event is influenced by one or more preceding fuel injection events of an engine cycle, the respective delivered injected fuel mass of the corresponding fuel injection event can result in an unacceptable repeatability over the course of a plurality of engine cycles and the consecutive fuel injection events are considered closely-spaced. More generally, any consecutive actuator events wherein residual flux from the preceding actuator event affects performance of the subsequent actuator event relative to a standard, for example relative to performance in the absence of residual flux, are considered closely-spaced.

Exemplary embodiments are further directed toward providing feedback signal(s) 42 from the fuel injector 10 to the activation controller 80. Discussed in greater detail below, sensor devices may be integrated within the fuel injector 10 for measuring various fuel injector parameters for obtaining the flux linkage of the electrical coil 24, voltage of the electrical coil 24, current through the electrical coil 24 and resistance of the electrical coil 24. A current sensor may be provided on a current flow path between the activation controller 80 and the fuel injector to measure the current provided to the electrical coil 24, or the current sensor can be integrated within the fuel injector 10 on the current flow path. The fuel injector parameters provided via feedback signal(s) 42 may include the flux linkage, voltage and current directly measured by corresponding sensor devices integrated within the fuel injector 10. Resistance can be estimated based on combinations of the flux linkage, voltage and current. Additionally or alternatively, the fuel injector parameters may include proxies provided via feedback signal(s) 42 to—and used by—the control module 60 to estimate the flux linkage, magnetic flux, the voltage, the current and the resistance within the fuel injector 10. The resistance of the electrical coil can be useful for determining an operating temperature of the fuel injector 10. Having feedback of the flux linkage of the electrical coil 24, the voltage of the electrical coil 24, current provided to the electrical coil 24, and resistance of the electrical coil 24, the control module 60 may advantageously modify the activation signal 75 to the fuel injector 10 for multiple consecutive injection events. It will be understood that conventional fuel injectors controlled by open loop operation, are based solely upon a desired current waveform obtained from look-up tables, without any information related to the force producing component of the flux linkage (e.g., magnetic flux) affecting movement of the armature portion 21 and the operating temperature of the fuel injector 10. As a result, conventional feed-forward fuel injectors that only account for current flow for controlling the fuel injector, are prone to instability in consecutive fuel injection events that are closely-spaced.

The fuel injector 10 of FIG. 1 further includes a search coil 25 that is mutually magnetically coupled to the electrical coil 24. The search coil may be wound onto the solid core of the electrical coil and core assembly 24. Hereinafter, the electrical coil 24 will be interchangeably referred to as a "main coil". The search coil 25 is depicted for illustration purposes to be outside of the body of the fuel injector; however, embodiments herein are directed toward the search coil 25 to be either integral to, or integrated within, the fuel injector 10. Embodiments herein include the search coil 25 positioned within a magnetic field path generated by the main coil 24. Therefore, the search coil 25 is not limited to any specific configuration or spatial orientation. In one embodiment, the search coil 25 is wound adjacent to the main coil 24. In another embodiment, the search coil 24 is wound around the main coil 25. The search coil 25 can be utilized for obtaining the magnetic flux within the fuel injector 10 and estimating a resistance of the main coil 24 for estimating an operating temperature of the fuel injector 10.

Figure 2:
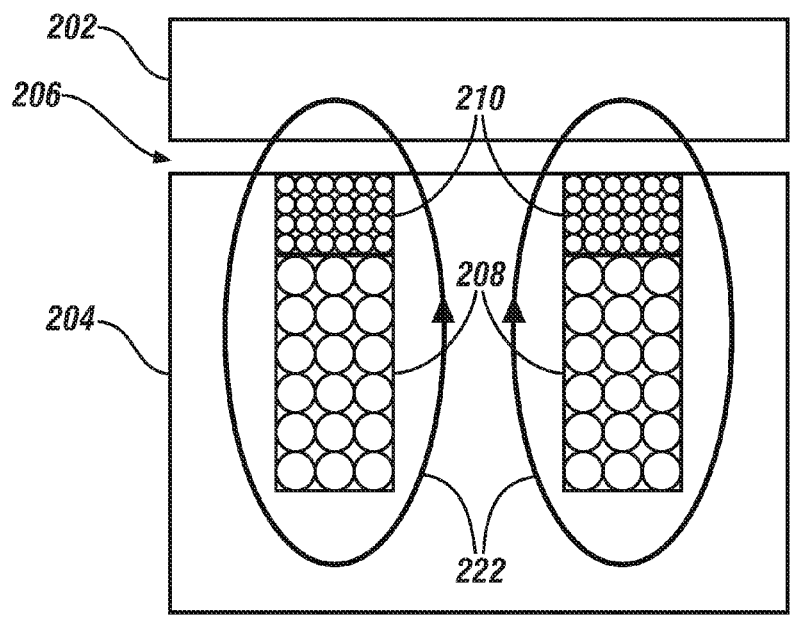
FIG. 2 illustrates a schematic sectional view of a magnetic structure according to the fuel injector and activation controller of FIG. 1, in accordance with the present disclosure.

FIG. 2 illustrates a schematic sectional view of a non-limiting magnetic structure according to the fuel injector and activation controller of FIG. 1. The magnetic structure may include first and second cores 202, 204, respectively, separated by a small air gap 206. A main coil 208 may be wound onto the second core 204 and a separate search coil 210 may be wound adjacent to, or around, the main coil 208 such that the search coil 210 is within a magnetic flux path generated by the main coil 208 when the main coil is energized by an electric current. Accordingly, the main coil 208 and the search coil 210 are mutually magnetically coupled. The search coil 210 can include terminal leads electrically connected to a voltage sensor. The search coil 210 can be utilized to indirectly measure magnetic flux generated in the gap 206 when the electric current flows through the main coil 208. The flux-linkage of the search coil may generate a voltage induced in the search coil 210 in accordance with the following relationship:

$$V_{SC} = \frac{d\lambda}{dt} \quad [1]$$

wherein
  $V_{SC}$ is the search coil voltage,
  $\lambda$ is the flux-linkage, and
  t is time.

The magnetic flux in the air gap 206 thus may be obtained from an integration in accordance with the following relationship:

$$\varphi = \frac{1}{N} \int V_{SC} dt \quad [2]$$

wherein
  $\varphi$ is the magnetic flux in the air gap, and
  N is a prescribed number of turns in the search coil.

Accordingly, the search coil 210 can advantageously be used to obtain the magnetic flux in the air gap when the voltage induced in the search coil is obtained using EQ. [1]. Without the search coil 210, obtaining the magnetic flux in the air gap 206 would require accounting for unknown resistance drops within the main coil 25 to obtain the voltage of the main coil 208. The relationships obtained from the non-limiting magnetic structure of FIG. 2 can be applied for obtaining various parameters within the fuel injector 10 of FIG. 1. The main and search coils 208, 210, respectively, of the non-limiting magnetic structure of FIG. 2 correspond to the main and search coils 24, 25, respectively, of FIG. 1. Likewise, the first core 202 of the non-limiting magnetic structure of FIG. 2 corresponds to the armature portion 21 of FIG. 1.

Referring back to FIG. 1, the search coil 25 can serve as one of the aforementioned sensor devices utilized to provide feedback signal(s) 42 to the activation controller 80. Specifically, the search coil 25 is provided to indirectly obtain the magnetic flux within the fuel injector. In the illustrated embodiment, the mutually magnetic coupling between the main and search coils 24, 25, respectively, includes a mutual coupling indicative of being tight, e.g., a mutual coupling equal to 0.99. Under this scenario, the flux-linkage for each of the main and search coils 24, 25, respectively, is substantially identical. Thus, embodiments herein will imply that the flux-linkage for one of the main and search coils 24, 25, respectively, is equal to the flux-linkage for the other one of the main and search coils 24, 25, respectively.

Exemplary embodiments herein are directed toward obtaining a voltage induced in the search coil 25 and using relationships that are innate to the mutually magnetic coupling between the main and search coils 24, 25, respectively, to estimate a resistance of the main coil 24. A voltage induced in main coil 24 can be expressed by the following relationship:

$$V_{MC} = (R \times i) + \frac{d\lambda}{dt} \quad [3]$$

wherein
  $V_{MC}$ is the main coil voltage,
  $\lambda$ is the flux-linkage,
  R is the resistance of the main coil,
  i is the measured current through the main coil, and
  t is time.

From EQ. [3], it is appreciated that the main coil voltage, $V_{MC}$, includes a simple voltage drop component (R×i) and a rate of change of flux-linkage component $$\left(\frac{d\lambda}{dt}\right).$$

Since the mutual coupling between the main coil 24 and the search coil 25 indicates the flux-linkage for each of the coils is substantially identical, the $V_{SC}$ term of EQ. [1] can be substituted into EQ. [3] to replace the change of flux-linkage component $$\left(\frac{d\lambda}{dt}\right).$$

The voltage induced in the search coil 25, $V_{SC}$, can be measured directly by a voltage sensor electrically coupled to terminal leads of the search coil 25. Thus, subtracting the measured search coil voltage from the measured main coil voltage yields the voltage drop component. And simple division by the measured current therefore yields the main coil resistance. It is appreciated that during dynamic periods of magnetic flux (e.g. times when main coil current is changing), the relationships set forth above may advantageously be used in the determination of the main coil resistance.

Moreover, the measured voltage induced in the search coil ($V_{SC}$) 25 is proportional to the voltage induced in the main coil ($V_{MC}$) 24 based on a turns-ratio between a number of turns for each of the coils 24 and 25. Accordingly, $V_{SC}$ can be expressed by the following relationship:

$$V_{SC} = k \times V_{MC} \quad [4]$$

wherein k is the turns-ratio of the number of turns of the main coil to the number of turns of the search coil.

Therefore, EQ. [4] can be substituted into EQ. [3] to yield estimation for the resistance of the main coil 24 in accordance with the following relationship:

$$R = \frac{V_{MC} - k \times V_{MC}}{i} \quad [5]$$

The resistance of the main coil 24 can be correlated to an operating temperature of the fuel injector 10. Parameters utilized by EQs. [1]-[5], can be provided via feedback signal(s) 42 to the activation controller 80 for estimating the resistance of the main coil 24. The activation controller 80 may be able to retrieve test data stored within an internal or external memory device that correlates a test resistance to a known temperature. Based on the resistance of the main coil 24 estimated utilizing EQ. [5], the test resistance and the known temperature, the operating temperature of the fuel injector 10 can be determined as follows.

$$R(T) = R_0[(1 + \alpha(T - T_0)] \quad [6]$$

wherein $R_0$ is a predetermined resistance of the main coil at a predetermined temperature $T_0$, $T_0$ is the predetermined temperature, T is the operating temperature of the fuel injector, and α is a temperature coefficient of the main coil.

In one embodiment, the temperature coefficient is the temperature coefficient of copper.

Exemplary embodiments include estimating the resistance of the main coil 24 only when the main coil 24 is energizing and the measured current of the main coil is greater than a current threshold. In a non-limiting example, the current threshold is equal to 1.0 Amps. In one embodiment, the resistance of the main coil 24 can be estimated a prescribed number of times per injection cycle of the fuel injector 10. In another embodiment, the resistance of the main coil 24 can be estimated once per injection cycle. In even yet another embodiment, the resistance of the main coil 24 can be estimated one only during prescribed injection cycles. The operating temperature of the fuel injector determined by EQ. [6] can be utilized by the activation controller to provide compensation when the operating temperature varies over a wide range of temperatures.

Figure 3:
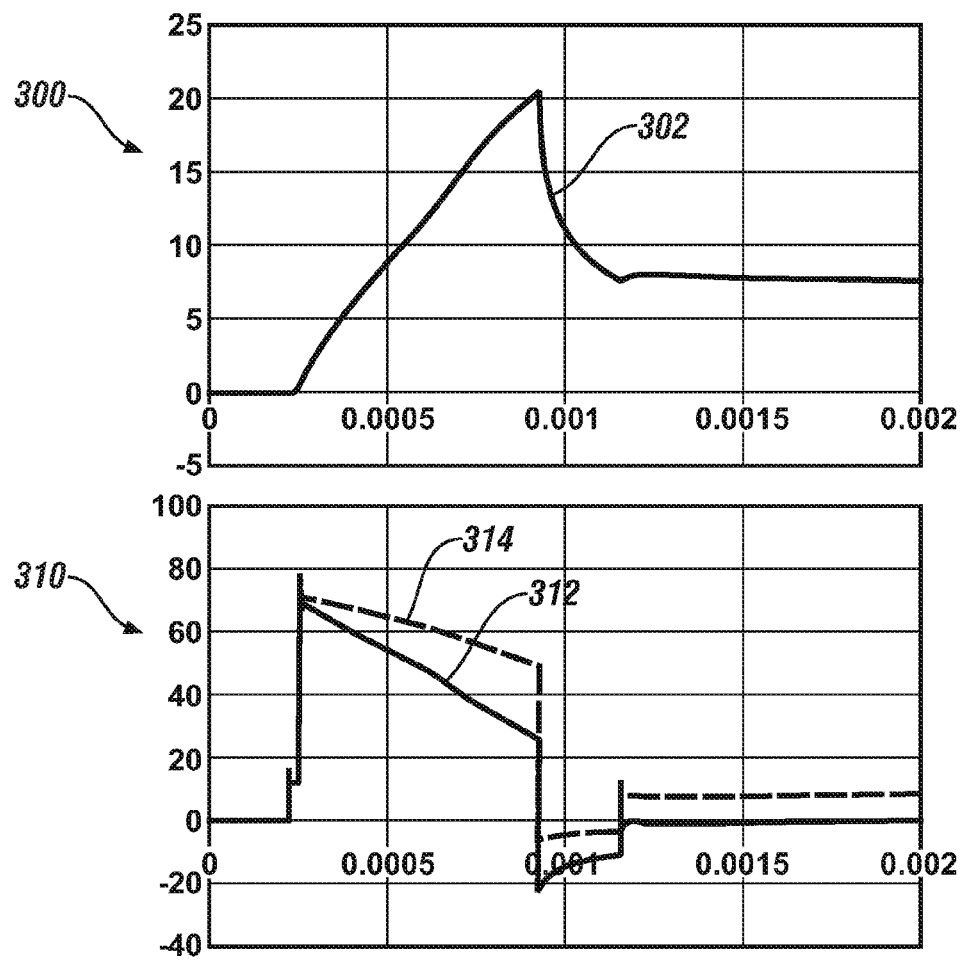
FIG. 3 illustrates non-limiting exemplary plots of measured main and search coil voltage profiles in response to a measured current profile through a main coil during a fuel injection event, in accordance with the present disclosure.

FIG. 3 illustrates non-limiting exemplary plots of measured main and search coil voltage profiles in response to a measured current profile through a main coil during a fuel injection event. The horizontal x-axis in each of plots 300 and 310 denotes time in seconds. Referring to plot 300, the measured current profile 302 through the main coil is illustrated, wherein the vertical y-axis denotes current in Amperage. The measured current profile 302 indicates a current waveform for the fuel injection event over a duration that includes an initial peak pull-in current and a secondary hold current. Referring to plot 310, the measured main and search coil voltage profiles 314, 312, respectively, are illustrated, wherein the vertical y-axis denotes voltage in Volts. The measured main coil voltage profile 314 indicates a measured voltage induced in a main coil responsive to the measured current profile 302 of plot 300 for controlling activation of the fuel injector during the fuel injection event. A search coil is mutually magnetically coupled to the main coil, as described above with reference to the non-limiting magnetic structure of FIG. 2. Accordingly, the measured search coil voltage profile 312 indicates a measured voltage induced in the search coil responsive to the measured current profile 302 of plot 300 due to the mutually magnetically coupling. As illustrated in plot 310, the measured search coil voltage profile 312 is proportional to the measured main coil voltage profile 314 based on a turns-ratio between the main coil and the search coil, as described above with reference to EQ. [4].

Figure 4:
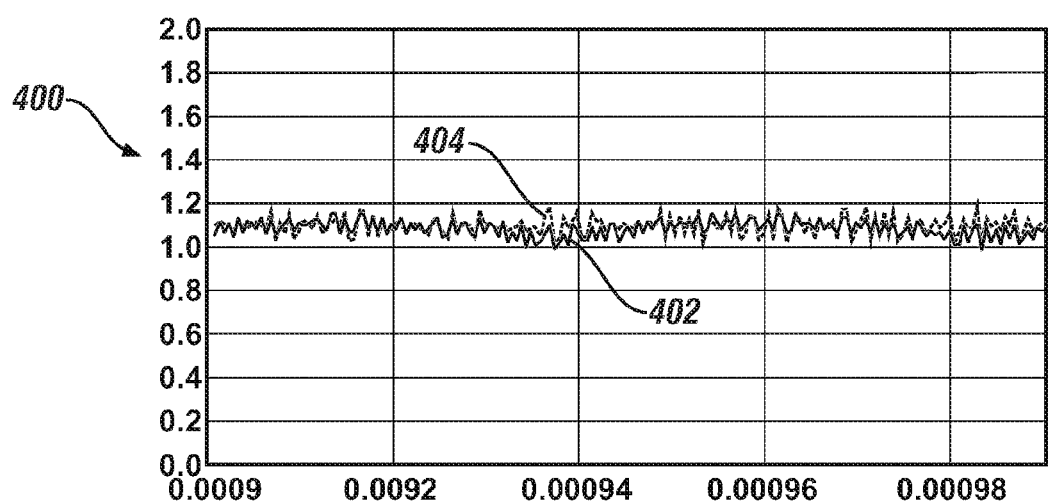
FIG. 4 illustrates a comparison between an actual resistance profile of the main coil of FIG. 3 and an estimated resistance profile of the main coil, in accordance with the present disclosure.

FIG. 4 illustrates a non-limiting exemplary plot comparing an actual resistance profile of the main coil of FIG. 3 and an estimated resistance profile of the main coil. The horizontal x-axis of the plot 400 denotes time in seconds and the vertical y-axis denotes resistance in ohms. The actual resistance profile 402 represents a measured resistance of the main coil of FIG. 3 when energized by an electrical current. The estimated resistance profile 404 represents a resistance of the main coil of FIG. 3 that is estimated using EQs. [1]-[5]. As illustrated, the estimated resistance profile 404 is substantially similar to the actual resistance profile 402.

The disclosure has described certain preferred embodiments and modifications thereto. Further modifications and alterations may occur to others upon reading and understanding the specification. Therefore, it is intended that the disclosure not be limited to the particular embodiment(s) disclosed as the best mode contemplated for carrying out this disclosure, but that the disclosure will include all embodiments falling within the scope of the appended claims.

The invention claimed is:

1. A method for parameter estimation in an electromagnetic actuator comprising a main coil and a search coil adjacently arranged to tightly couple flux-linkage between the main coil and the search coil, the method comprising:
    driving a current through the main coil;
    determining a main coil voltage;
    determining a search coil voltage induced by a tightly coupled flux-linkage between the main coil and the search coil;
    determining a main coil current; and
    estimating a main coil resistance in accordance with the following relationship:

$$R = \frac{V_{MC} - V_{SC}}{i}$$

wherein R is main coil resistance,
$V_{MC}$ is main coil voltage,
$V_{SC}$ is search coil voltage, and
i is main coil current.

2. The method of claim 1 further comprising estimating actuator temperature in accordance with the following relationship:

$$R(T)=R_0[(1+\alpha(T-T_0)]$$

wherein R(T) is main coil resistance,
T is actuator temperature,
$R_0$ is a predetermined resistance of the main coil at a predetermined temperature $T_0$,
$T_0$ is the predetermined temperature, and
α is a temperature coefficient of the main coil.

3. The method of claim 1, wherein estimating said main coil resistance is effected when main coil current is greater than a predetermined current threshold.

4. The method of claim 1, wherein estimating said main coil resistance is effected a prescribed number of times per a cycle of the actuator.

5. An electromagnetic actuator system, comprising:
a main coil;
a search coil adjacent to and mutually magnetically coupled with the main coil to tightly couple flux-linkage between the main coil and the search coil;
a control module configured to:
drive a current through the main coil;
determine a main coil voltage;
determine a search coil voltage induced by the tightly coupled flux-linkage between the main coil and the search coil;
determine a main coil current; and
estimate a main coil resistance in accordance with the following relationship:

$$R = \frac{V_{MC} - V_{SC}}{i}$$

wherein R is main coil resistance,
$V_{MC}$ is main coil voltage,
$V_{SC}$ is search coil voltage, and
i is main coil current.

6. The electromagnetic actuator system of claim 5 wherein said control module is configured to estimate main coil temperature in accordance with the following relationship:

$$R(T)=R_0[(1+\alpha(T-T_0)]$$

wherein R(T) is main coil resistance,
T is actuator temperature,
$R_0$ is a predetermined resistance of the main coil at a predetermined temperature $T_0$,
$T_0$ is the predetermined temperature, and
α is a temperature coefficient of the main coil.

7. The electromagnetic actuator system of claim 5, wherein the search coil is wound axially adjacent to the main coil.

8. The electromagnetic actuator system of claim 5, wherein the search coil is wound around the main coil.

9. An electromagnetic fuel injection system, comprising:
a fuel injector comprising:
a main coil; and
a search coil adjacent to and mutually magnetically coupled with the main coil to tightly couple flux-linkage between the main coil and the search coil;
a control module configured to:
drive a current through the main coil;
determine a main coil voltage;
determine a search coil voltage induced by the tightly coupled flux-linkage between the main coil and the search coil;
determine a main coil current; and
estimate a main coil resistance in accordance with the following relationship:

$$R = \frac{V_{MC} - V_{SC}}{i}$$

wherein R is main coil resistance,
$V_{MC}$ is main coil voltage,
$V_{SC}$ is search coil voltage, and
i is main coil current.

10. The fuel injection system of claim 9 wherein said control module is configured to estimate main coil temperature in accordance with the following relationship:

$$R(T)=R_0[(1+\alpha(T-T_0)]$$

wherein R(T) is main coil resistance,
T is main coil temperature,
$R_0$ is a predetermined resistance of the main coil at a predetermined temperature $T_0$,
$T_0$ is the predetermined temperature, and
α is a temperature coefficient of the main coil.

11. The fuel injection system of claim 9, wherein the search coil is wound axially adjacent to the main coil.

12. The fuel injection system of claim 9, wherein the search coil is wound around the main coil.

13. The fuel injection system of claim 9, wherein the control module is further configured to determine a fuel injector activation signal based upon the main coil temperature.

14. An electromagnetic actuator system, comprising:
a main coil;
a search coil mutually adjacent to and magnetically coupled with the main coil to tightly couple flux-linkage between the main coil and the search coil;
a control module configured to:
drive a current through the main coil;
determine a main coil voltage;
determine a main coil current; and
estimate a main coil resistance in accordance with the following relationship:

$$R = \frac{V_{MC} - kV_{MC}}{i}$$

wherein R is main coil resistance,
$V_{MC}$ is main coil voltage,
k is the ratio of the number of turns of the main coil to the number of turns of the search coil, and
i is main coil current.

* * * * *